(12) United States Patent
Najda

(10) Patent No.: US 6,486,491 B1
(45) Date of Patent: Nov. 26, 2002

(54) SEMICONDUCTOR DEVICE

(75) Inventor: Stephen Peter Najda, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 27 days.

(21) Appl. No.: 09/633,355

(22) Filed: Aug. 4, 2000

(30) Foreign Application Priority Data

Sep. 1, 1999 (GB) .............................................. 9920496

(51) Int. Cl.[7] .............................................. H01L 29/06
(52) U.S. Cl. .............................. 257/18; 257/96; 372/45
(58) Field of Search .................. 372/45, 46; 257/14, 257/15, 17, 18, 22, 94, 96, 184, 190, 13

(56) References Cited

U.S. PATENT DOCUMENTS

| | | | |
|---|---|---|---|
| 5,331,656 A | 7/1994 | Tanaka | 372/45 |
| 5,841,152 A | 11/1998 | Ishikawa | 257/14 |
| 5,903,587 A | 5/1999 | Miyashita | 372/45 |
| 6,219,365 B1 * | 4/2001 | Mawst et al. | 372/46 |

FOREIGN PATENT DOCUMENTS

| | | |
|---|---|---|
| EP | 0 476 689 A2 | 3/1992 |
| EP | 0 760 545 | 8/1996 |
| EP | 0 814 548 | 6/1997 |
| JP | 7-74431 | 3/1995 |
| JP | 7-122813 | 5/1995 |
| JP | 11-145549 | 5/1999 |

* cited by examiner

*Primary Examiner*—Sara Crane
(74) *Attorney, Agent, or Firm*—Renner, Otto, Boisselle & Sklar (57) ABSTRACT

An (Al,Ga,In)P semiconductor laser device has an optical region disposed between n-type and p-type cladding layers. An active region containing quantum well active layers and barrier layers disposed alternately with the quantum well layers is provided within the optical guiding region. Strained layers of $In_xGa_{1-x}P$ are used as the barrier layers. The active region is thus aluminium-free, and this reduces the oxygen impurity concentration in the active region thereby improving the performance and reliability of the laser. An aluminium-free spacer layer can be provided between one of the cladding layers and the quantum well active layer disposed closest to that cladding layer. The invention may be applied to other semiconductor devices, for example such as an LED.

30 Claims, 10 Drawing Sheets

SEMICONDUCTOR DEVICE

BACKGROUND OF THE INVENTION

1. Field of the Invention

This invention relates to a semiconductor device and particularly, but not exclusively, to a semiconductor device that emits visible radiation in the wavelength range 630 nm to 680 nm, such as a semiconductor laser device or light-emitting diode. The device may be of the edge-emitting or of the surface-emitting type.

2. Description of the Related Art

Laser devices or laser diodes (LDs) fabricated in the (Al,Ga,In)P material system which emit visible light in the 630 nm–680 nm wavelength range are becoming increasingly important components of professional and consumer products. For example, it is envisaged that the Digital Video Disc (DVD) system will employ a 635 nm–650 nm wavelength LD capable of delivering up to 30 mW output power up to a temperature of 60° C. The next generation of semiconductor lasers will need an even greater maximum power output up to a higher (eg. 70° C.) operating temperature.

By the (Al,Ga,In)P system is meant the family of compounds having the general formula $(Al_xGa_{1-x})_{1-y}In_yP$, where both x and y are between 0 and 1. One particular advantage of this semiconductor system is that it is lattice-matched to a GaAs substrate when the indium mole fraction, y, is equal to 0.48.

A principal limitation of current (Al,Ga,In)P laser diodes is that they are incapable of operating for long periods (or with a sufficiently low threshold current) at the highest specified operating temperature. It is generally believed that this in caused by electron leakage from the active region of the device into the surrounding optical guiding region and subsequently into the p-type cladding region.

The generic structure of a separate confinement laser structure intended to generate light at 630–680 nm will now be described with reference to FIGS. 1(a), 1(b) and 1(c).

Figure 1A:
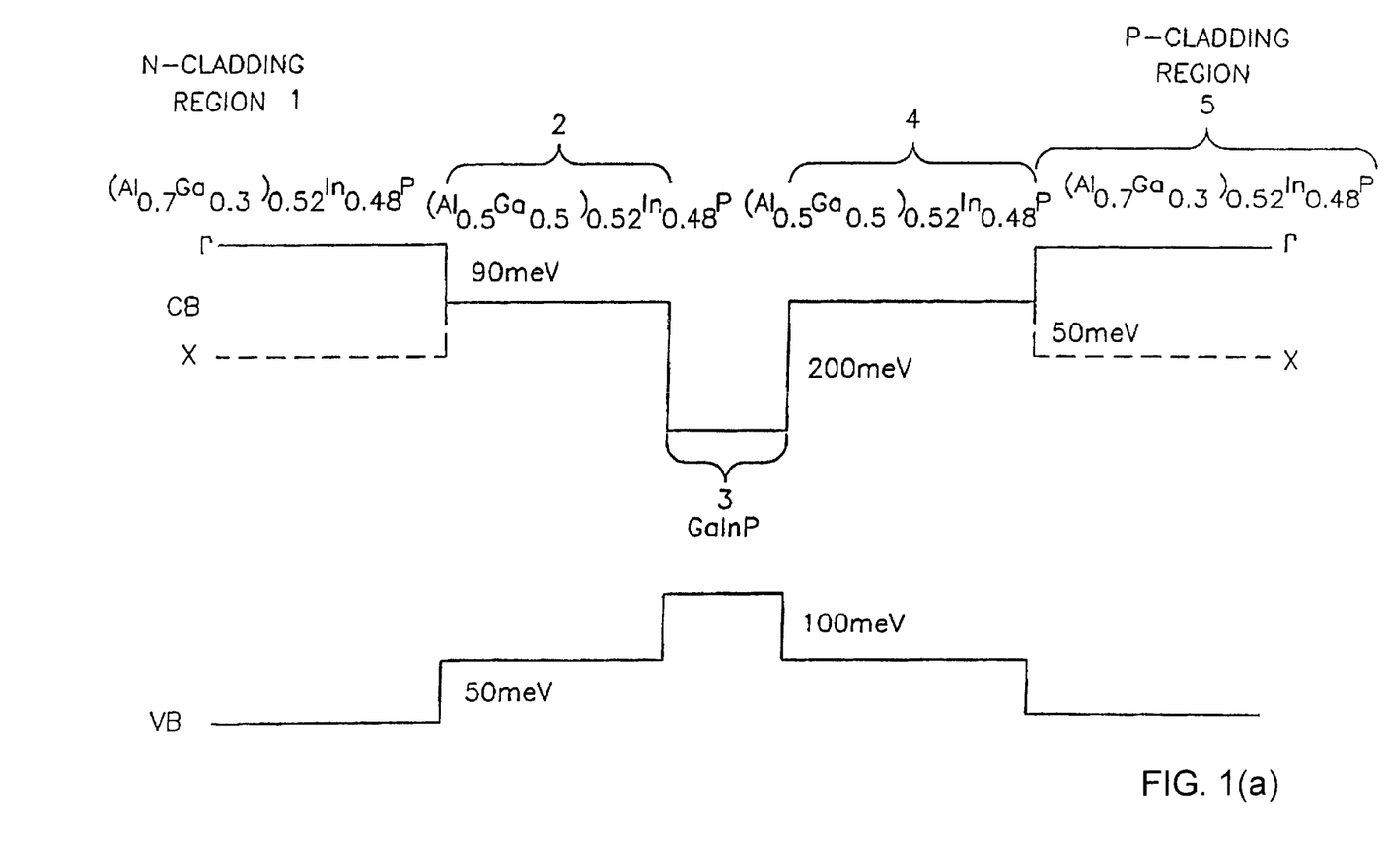
FIG. 1(a) is a schematic band-gap diagram of a conventional (Al,Ga,In)P laser device.

FIG. 1(a) is a schematic band structure of a separate confinement laser structure fabricated in the (Al,Ga,In)P system. It consists of an n-doped $(Al_{0.7}Ga_{0.3})_{0.52}In_{0.48}P$ cladding region 1, an $(Al_{0.5}Ga_{0.5})_{0.52}In_{0.48}P$ optical guiding region 2, 4, a GaInP quantum well active region 3 disposed within the $(Al_{0.5}Ga_{0.5})_{0.52}In_{0.48}P$ optical guiding region, and a p-doped $(Al_{0.7}Ga_{0.3})_{0.52}In_{0.48}P$ cladding region 5. A p-type contact layer (not shown in FIG. 1(a)) may be provided on the p-type cladding region 5, and an n-type contact layer (not shown) may be provided on the n-type cladding region 1. Optical transitions giving rise to laser action in the quantum well active region 3 of the laser diode originate from electrons in the Γ-band in the GaInP quantum well active region.

The terms Γ-band and X-band as used herein refer to symmetry points in the Brillouin zone and are standard terms in solid state physics, see for example R. A. Smith "Semiconductors", (Cambridge University Press, 1978). The terms Γ-minimum and X-minimum refer to the minimum energy level of the Γ-band and the X-band, respectively.

The minimum energy in the conduction band of (Al,Ga,In)P is a function of the aluminium content. There is a crossover from a Γ-band minimum to an X-band minimum at an aluminium concentration of about 0.55.

The aluminium mole fraction of the cladding regions 1, 5 need not be 0.7, provided that it is sufficient to provide an effective potential barrier to confine Γ-electrons in the optical guiding region. FIG. 1(b) illustrates a similar laser structure to that of FIG. 1(a), but the cladding regions 1, 5 are formed of AlInP rather than $(Al_{0.7}Ga_{0.3})_{0.52}In_{0.48}P$ in order to increase the potential barrier confining Γ-electrons in the optical guiding region 2, 4.

Figure 1B:
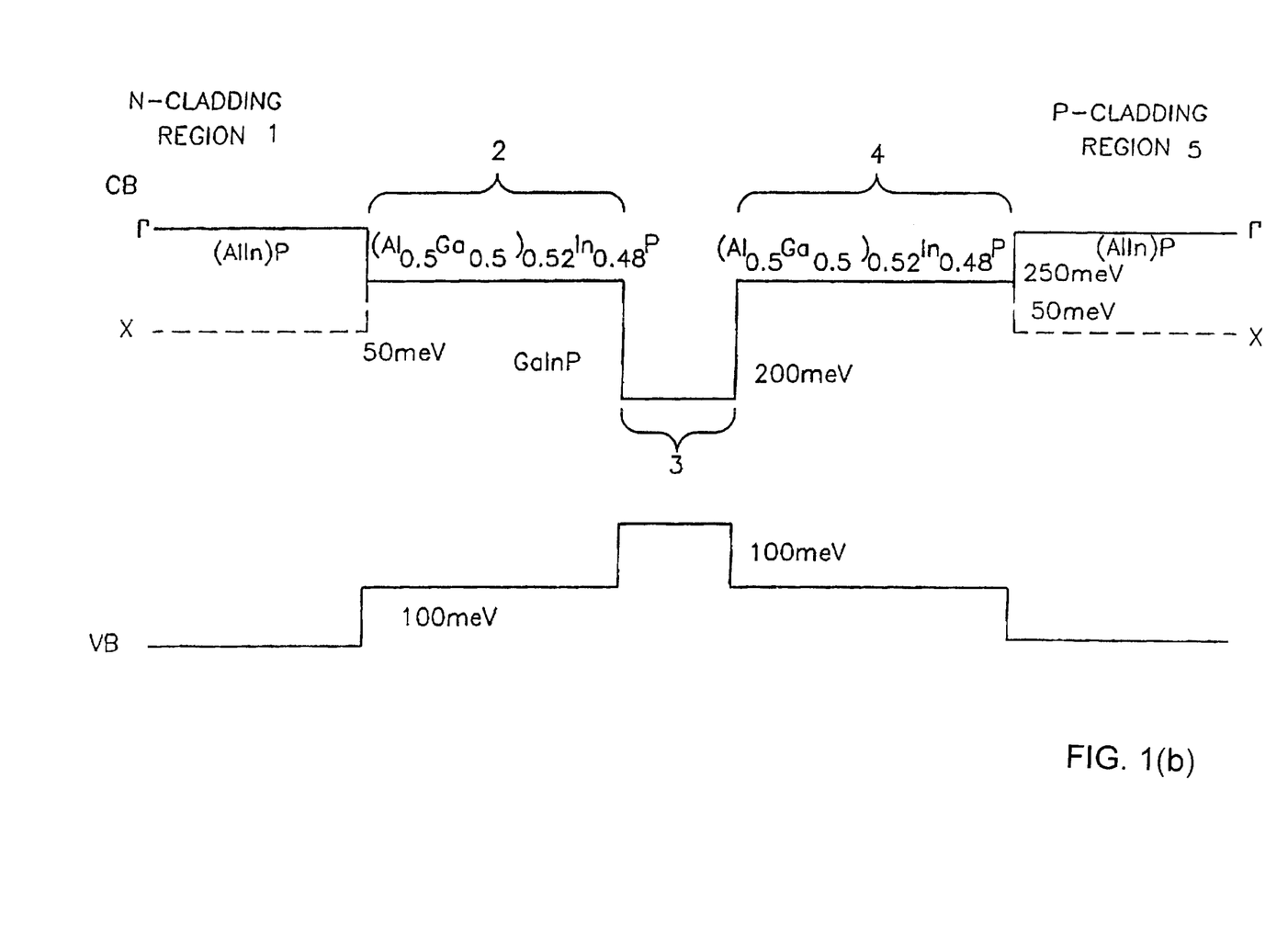
FIG. 1(b) is a schematic band-gap diagram of another conventional (Al,Ga,ln)P laser device.

In the laser structures shown in FIGS. 1(a) and 1(b) the active region 3 is a single GaInP quantum well layer. It is alternatively possible for the active region to contain two or more quantum well layers separated by barrier layers.

Figure 1C:
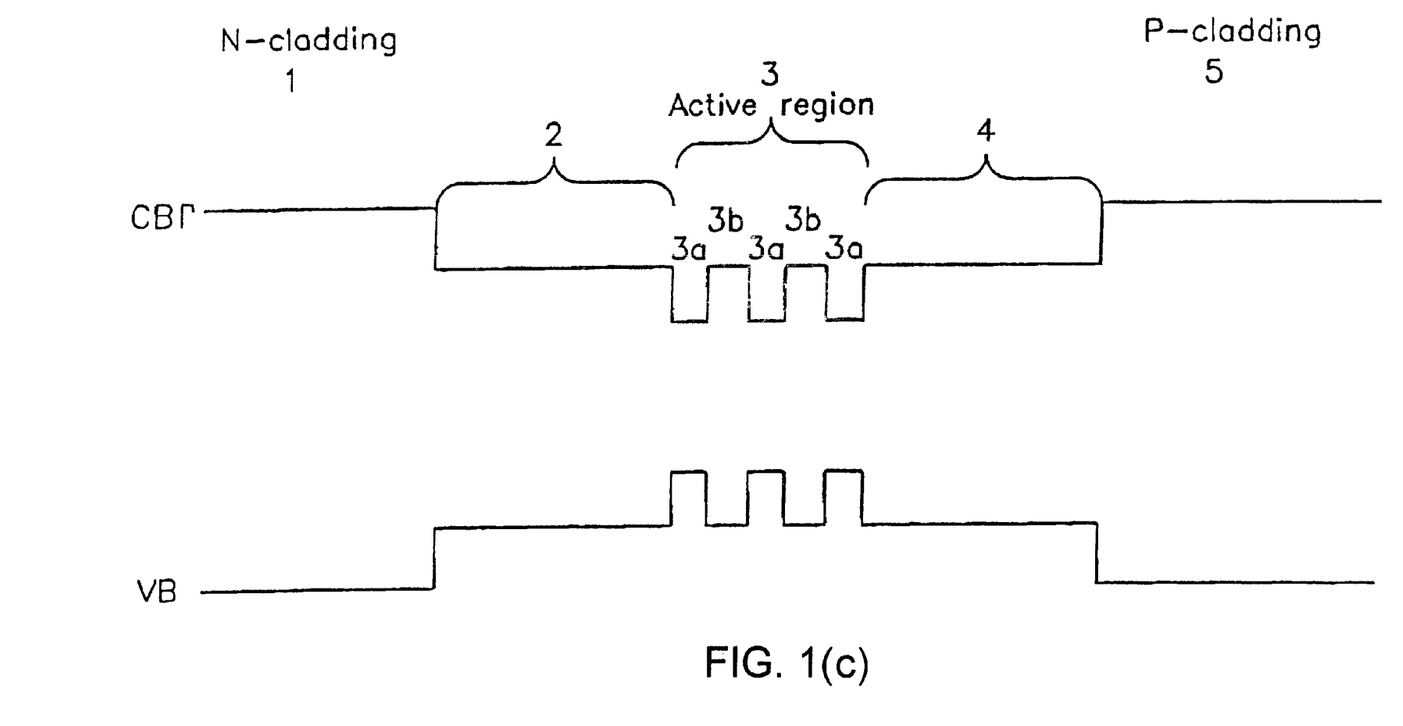
FIG. 1(c) is a schematic band-gap diagram of a conventional (Al,Ga,In)P laser In which the active region includes a plurality of quantum well layers.

FIG. 1(c) shows the Γ-conduction band and valence band of a (Al,Ga,In)P laser device in which the active region comprises a plurality of quantum well layers. In the embodiment shown in FIG. 1(c), the active region 3 comprises three GaInP quantum well layers 3a with each neighbouring pair of quantum well layers being separated by a barrier layer 3b. The barrier layers 3b are formed of a material having a higher Γ-band than the material used to form the quantum well layers 3a, such as $(Al_{0.3}Ga_{0.7})_{0.52}In_{0.48}P$ or $(Al_{0.5}Ga_{0.5})_{0.52}In_{0.48}P$. In the laser shown in FIG. 1(c) the barrier layers 3b are formed of $(Al_{0.5}Ga_{0.5})_{0.52}In_{0.48}P$, the same material as used for the optical guiding region 2, 4.

Degradation of semiconductor lasers has been a major problem in developing commercial devices. AlGaAs/GaAs lasers having a lasing wavelength of around 0.85 $\mu$m were initially developed in the 1970s, but early examples of these lasers degraded quickly during use and, as a result, had a low lifetime and were unsuitable for commercial applications. It took a considerable time to overcome the significant degradation problems involved with these lasers, but long lifetime AlGaAs/GaAs lasers are now commercially available. M. Fukuda reports, in "Reliability and Degradation of Semiconductor Lasers and LEDEs" ISBN 0-89006-465-2, that AlGaAs/GaAs lasers having a life time greater than 10,000 hours are now commercially available.

In order for (Al,Ga,In)P lasers to be commercially successful, these lasers must have a life time comparable with that of AlGaAs/GaAs lasers.

At present, wide band-gap phosphide lasers operating in the visible spectrum at a wavelength of about 650 nm display a severe degradation problem. Although the lifetime of low power phosphide lasers is approximately 10,000 hours which is satisfactory for commercial purposes, a typical lifetime of a high-power phosphide laser is only about 5,000 hours which is not commercially acceptable. Furthermore, it is necessary to anneal the lasers in order to obtain these lifetimes, and lasers that are not annealed have much shorter lifetimes.

The degradation problem is particularly serious for lasers fabricated using molecular beam epitaxy (MBE). At present, phosphide laser structures that are grown by MBE have to be thermally annealed in order to improve their reliability and to decrease the threshold for laser operation. It Is presumed that the annealing process removes (or at least moves) some of the non-radiative recombination centres in the material. It is, however, undesirable to carry out an annealing step. One common p-type dopant for the p-type cladding region is beryllium, and if a beryllium-doped laser device is annealed beryllium can diffuse from the p-type cladding region into the active region. Such diffusion will degrade the performance of the laser device, and may also lower the yield of the manufacturing process.

One possible reason for the degradation of phosphide lasers is that the degradation is due to oxygen contamination of the active region. Oxygen contamination of aluminium-containing phosphide materials can easily occur, owing to the high reactivity of aluminium with oxygen. Oxygen introduces non-radiative defects into the active layer, and this may give rise to a high threshold for laser oscillation.

Oxygen is a common contaminant in aluminium-containing alloys, because of the high reactivity of aluminium with oxygen-containing species. In the growth of AlGaAs/GaAs semiconductor structures, it is known that oxygen atoms are sufficiently mobile during the epitaxial growth process for them to migrate to the interface and to become trapped at the interface. Oxygen forms non-radiative centres in GaAs and in AlGaAs, and so the presence of oxygen tends to reduce the performance and reliability of AlGaAs/GaAs lasers. N. Chand et al. report, in "J. Vac. Sci Technol. B" Vol. 10 (2), p807, 1992, that an AlGaAs layer having an aluminium mole fraction of 0.3 or greater has a typical oxygen atom density of at least $10^{17}$ $cm^{-2}$. In contrast, in GaAs the oxygen concentration is typically too small to detect.

Chand et al. show that oxygen tends to accumulate at the AlGaAa/GaAs interface, so giving rise to an "oxygen spike" in the active region of the device. They also show that a beryllium-doped cladding layer has a greater oxygen concentration than a silicon-doped cladding region.

Figure 3A:
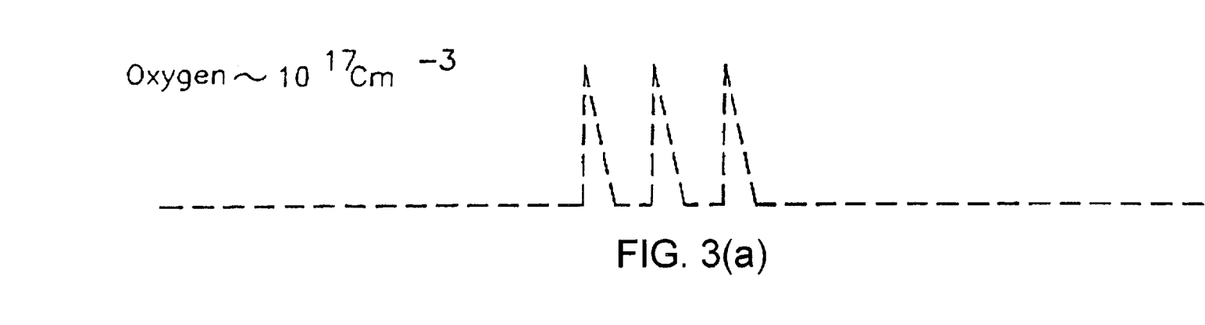
FIGS. 3(a) and 3(b) are schematic views of the conduction and valence bands of the laser shown in FIG. 1(c) together with the oxygen concentration of the structure.
Figure 3B:
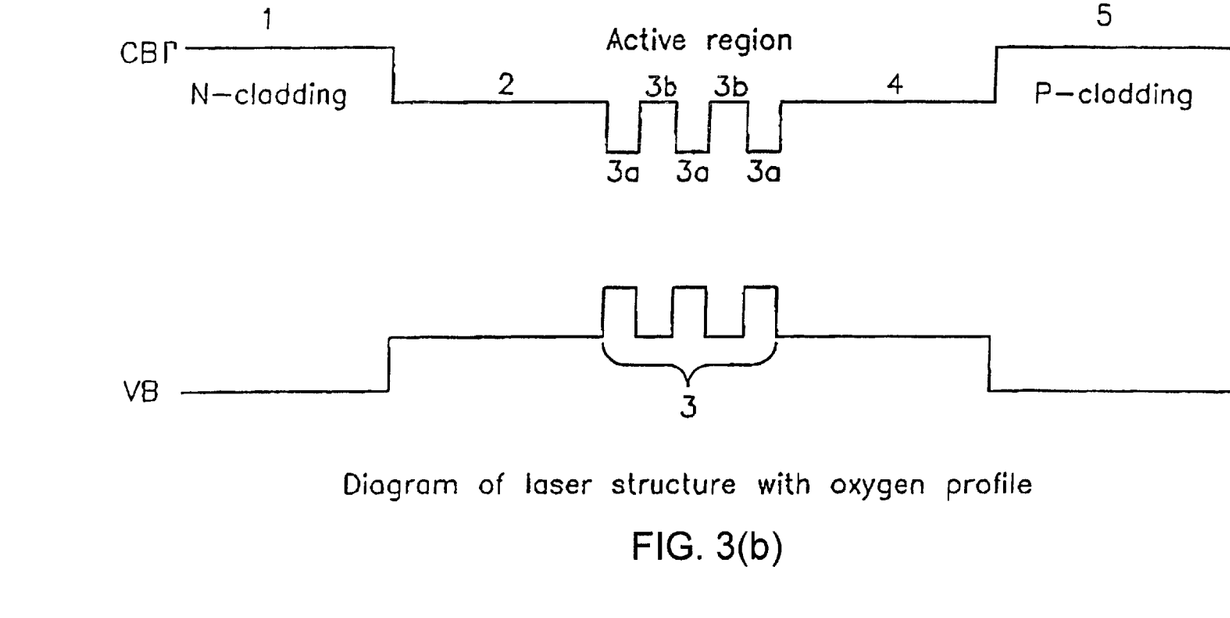

FIG. 3(a) shows the oxygen concentration of the laser of FIG. 1(c). The band structure of the laser is repeated in FIG. 3(b), so that the oxygen concentration can conveniently be related to the layers of the device.

The laser of FIG. 1(a) consists mainly of (Al,Ga,In)P with a non-zero aluminium content, so that its background oxygen concentration is expected to be approximately $10^{17}$ $cm^{-3}$. In the growth of this structure, oxygen migrates to the interfaces between the quaternary layers and the GaInP quantum well layers 3a. This gives rise to a localised high oxygen concentration, or "spike", in the regions of each interface. These spikes in the oxygen concentration increase the oxygen concentration in the active layers, and lead to the formation of non-radiative traps in the quantum well active layers. These traps degrade the performance and reliability of the laser, as discussed above.

Figure 4:
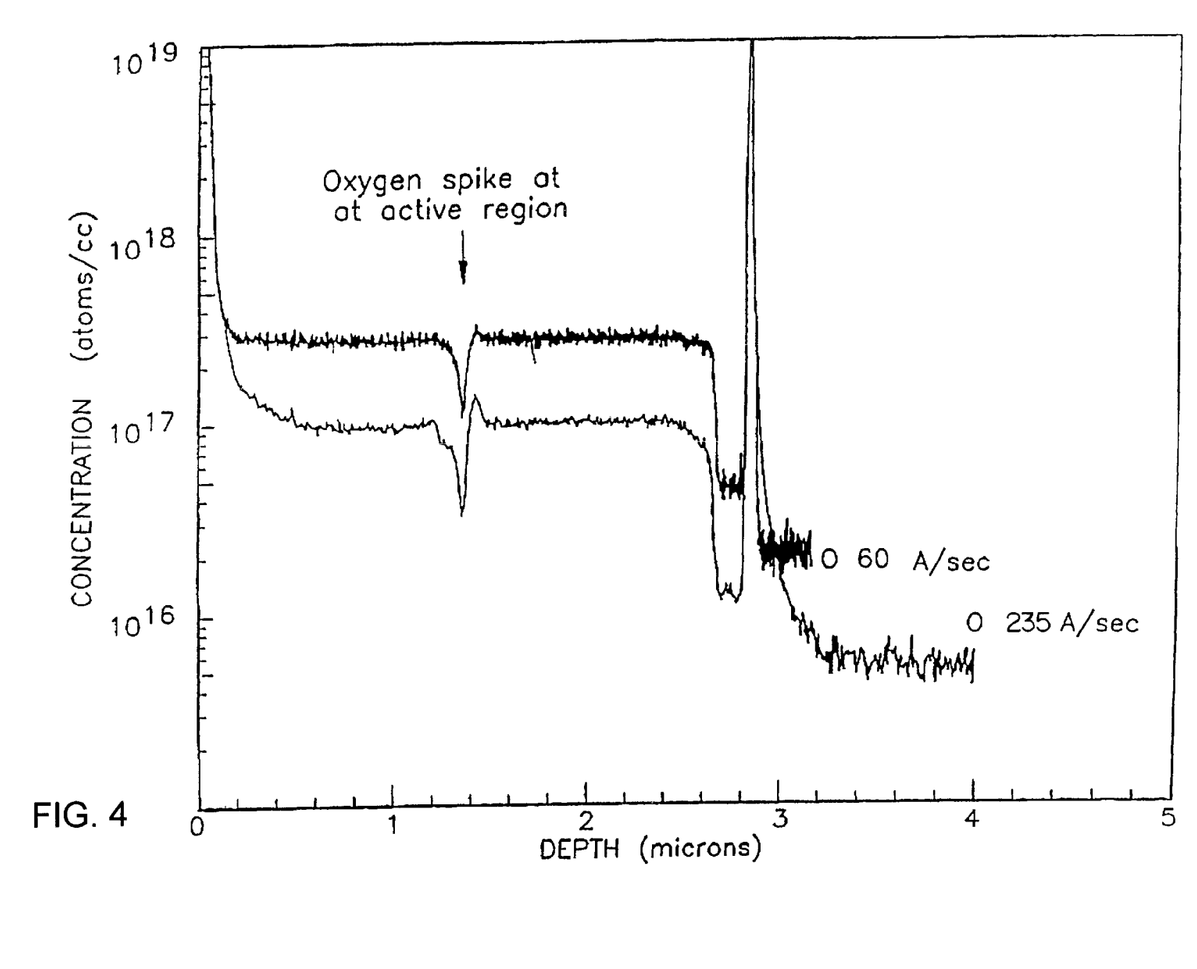
FIG. 4 shows the oxygen concentration for a conventional AlGaInP/GaInP laser structure.

FIG. 4 shows the oxygen concentration for a conventional laser structure fabricated in the (Al,Ga,In)P system. The oxygen concentration was measured by secondary ion mass spectrometry (SIMS). FIG. 4 shows the results of two measurements, carried out at different scanning rates.

The sample measured has an active region containing 3 GaInP quantum well layers sandwiched between $(Al_{0.5}Ga_{0.5})_{0.52}In_{0.48}P$ barrier layers, an $(Al_{0.5}Ga_{0.5})_{0.52}In_{0.48}P$ waveguiding region, and an $(Al_{0.7}Ga_{0.3})_{0.52}In_{0.48}P$ cladding region. The cladding region and the waveguiding region each have an oxygen concentration measured by SIMS of around $10^{17}$ $cm^{-3}$, compared to an oxygen concentration as low as $10^{15}$ $cm^{-3}$ in the GaInP quantum well layers (which are aluminium-free). There is therefore a sharp spike in the oxygen concentration at each interface between a barrier layer and a quantum well layer (in a similar manner to the case of GaAlAs/GaAs). The SIMS instrument cannot resolve such sharp features, so that FIG. 4 in fact shows a convolution of the oxygen level across the three quantum well layers. The single observed spike in the oxygen concentration is an artefact of the measurement technique.

The $(Al_{0.7}Ga_{0.5})_{0.52}In_{0.48}P$ cladding layer and the $(Al0.5 Ga_{0.5})_{0.52}In_{0.48}P$ optical guiding regions are measured as having oxygen concentrations of around $10^{17}$ $cm^{-3}$. The oxygen concentration in the active region is significantly greater than this. (As noted above, the single oxygen spike of FIG. 4 is an artefact of the measurement technique.)

The region at a depth of 2.6–2.8 μm is a GaInP layer which, as anticipated, is observed as having a low oxygen concentration. The oxygen spike that occurs at a depth of 2.8–3.0 μm is at the interface between the epilayer structure and the substrate, and is due to oxygen not having been completely removed from the substrate before the epitaxial growth process.

There have been a number of attempts to produce semiconductor laser devices having an aluminium-free active region. A. Al-Muhanna et al. have proposed, in "Applied Physics Letters" Vol. 72, No. 6, pages 641–642 (1998), a laser device in the InGaAlP system with an InGaAsP active layer. This laser emits light having a wavelength of 730 nm. they report that this laser has an improved efficiency, and they attribute this to the use of an aluminium-free active region.

Wade et al. report, in "Applied Physics Letters" Vol. 70, No. 2, pages 149–151 (1997), a laser emitting light at 830 nm and having an aluminium-free active region. This device again uses an InGaAsP layer as the active region, and this is disposed in an InGaP optical guiding region. Wade et al. report an improvement in the reliability of the laser, which is attributed to the use of an aluminium-free active region. They also report an improved COD (catastrophic optical mirror damage) power density level.

However, the approach of using a InGaAsP active layer cannot be used to obtain a laser device emitting light in the wavelength range 630 nm to 680 nm, because the band gap of InGaAsP is too small to produce emission in this wavelength range. This is the case for all III-V semiconductors (with the exception of the nitrides).

EP-A-0 476 689 discloses a laser device emitting in the 630–680 nm range in which the active region is formed of strained AlGaInP layers. The barrier layers are under tensile strain and the quantum well layers are under compressive strain and the different strains induce different band structures in the barrier and quantum well layers. This document also suggests that a similar approach could be used with an active region formed of strained GaInP layers, although the absence of aluminium would increase the emission wavelength of the laser.

The lasers suggested in EP-A-0 476 689 have an AlGaInP waveguide adjacent to the active region. Oxygen contamination will occur in the waveguide since it contains aluminium, and a spike in the oxygen concentration will occur at the interface between the active region and the waveguide.

U.S. Pat. No. 5,331,656 discloses a GaInP laser that emits in the 550–590 nm wavelength range. The active region contains quantum well layers and barrier layers both formed of GaInP doped with nitrogen. However, doping with nitrogen is difficult to carry out in practice. Moreover slight doping with nitrogen will not significantly change the alloy composition and so will not cause significant strain, whereas heavy doping with nitrogen will significantly reduce the bandgap.

Lasers having an active region in which the quantum well layers and barrier layers are oppositely strained are also disclosed in U.S. Pat. No. 5,903,587, JP-A-11 145 549 and U.S. Pat. No. 5,841,152. However, these documents do not relate to an (Al,Ga,In)P laser emitting in the 630–680 nm wavelength range. JP-11 145 549 discloses an MQW layer in which the quantum well layers and the barrier layers are both InGaAsP layers. The laser disclosed in U.S. Pat. No. 5,903,587 emits in the 0.98 to 1.02 μm range and has an active region containing barrier layers formed of GaAsP and quantum well layers formed of GaInAs. U.S. Pat. No. 5,841,852 discloses a laser emitting light having a wavelength of 1.3 µm, in which the barrier layers are InGaAsP, and the quantum well layers are InGaAs.

SUMMARY OF THE INVENTION

A first aspect of the present invention provides a semiconductor device having an aluminium-free active region, the active layer comprising one or more quantum well layers and one or more barrier layers, the quantum well layer and the barrier layer being disposed alternately; wherein the or each barrier layer is a strained layer; and wherein the device further comprises a first cladding layer and an aluminium-free layer disposed between the first cladding layer and the quantum well layer closest to the first cladding layer.

The term "aluninlum-free layer" as used herein refers to a layer that does not have aluminium as an intentional constituent.

Straining a layer of semiconductor material can increase the band-gap of the material. The use of a strained layer for the barrier layer(s) provides a barrier layer or layers having the necessary Γ-band energy to provide an effective barrier to the transport of Γ-electrons between neighbouring quantum well layers without the need to intentionally introduce aluminium into the barrier layer(s). The invention thus makes possible a device having an aluminium-free active region.

Moreover, oxygen is likely to accumulate at the interface with the first cladding layer during the growth process, leading to a region of high oxygen concentration. Providing an aluminium-free layer between the first cladding layer and the quantum well layer closest to the first cladding layer spaces the active region from this region of high oxygen concentration, and reduces the effect of the region of high oxygen concentration on the operating properties of the device.

A second aspect of the present invention provides a semiconductor device having an aluminium-free active region, the active layer comprising one or more quantum well layers and one or more barrier layers, the quantum well layer and the barrier layer being disposed alternately; wherein the or each barrier layer is a strained layer; and wherein the device emits, in use, light having a wavelength in the range 630 to 680 nm.

As noted above, the use of a strained layer for the barrier layer(s) avoids the need to intentionally introduce aluminium into the barrier layer(s). The invention thus makes possible a device having an aluminium-free active region and that can emit light in the 630–680 nm wavelength range of the visible spectrum. By avoiding the need to introduce aluminium into the active region of, for example, a laser device, degradation of the device owing to oxygen contamination of the active region is reduced and the lifetime of the device is consequently increased.

A device according to the second aspect of the invention may further comprise: a first cladding layer; and an aluminium-free spacer layer disposed between the first cladding layer and the quantum well layer closest to the first cladding layer.

A device according to the first aspect of the invention may emit, in use, light having a wavelength in the range 630–680 nm.

A device according to either aspect of the invention may emit, in use, light having a wavelength in the range 635–630 nm.

The or each barrier layer maybe a tensile strained layer.

The lattice mismatch between the or each barrier layer and the or each quantum well layer may be small. This increases the critical thickness of the barrier layer(s).

The or each quantum well layer may be lattice matched to the cladding layer(s). Alternatively, the or each quantum well layer may be a compressive strained layer. This allows a device with a strain compensated active region to be produced, by using a compressive strained layer for the or each quantum well layer and a tensile strained layer for the or each barrier layer.

The or each barrier layer may contain indium. Introducing indium into the barrier layer(s) reduces the strain in the barrier layer(s) and so increases the critical thickness of the barrier layer(s).

The aluminium-free layer may be a strained layer.

The device may be fabricated in the (Al,Ga,In)P material system. This allows for example a device emitting light in the region 630–680 nm and having an aluminium-free active layer to be produced.

The or each active layer may be a $Ga_xIn_{1-x}P$ layer and the or each barrier layer may be a $Ga_yIn_{1-y}P$ layer, where y>x. For example, the or each active layer may be a $Ga_{0.52}In_{0.48}P$ layer and the or each barrier layer may be a $Ga_{0.61}In_{0.39}P$ layer, or alternatively the or each active layer may be a $Ga_{0.52}In_{0.48}P$ layer and the or each barrier layer may be a $Ga_{0.71}In_{0.29}P$ layer. Tensile strained layers of $Ga_{0.61}In_{0.39}P$ and $Ga_{0.71}In_{0.29}P$ have approximately the same band-gap as $(Al_{0.3}Ga_{0.7})_{0.52}In_{0.48}P$ and $(Al_{0.5}Ga_{0.5})_{0.52}In_{0.48}P$ respectively, and so can be used to replace these materials without significantly affecting the band-gap profile.

Alternatively, the or each active layer may be a $Ga_{0.43}In_{0.57}P$ layer. This material has a smaller lattice constant that GaAs, and so will form a compressive strained layer when grown on a layer that to lattice matched to GaAs.

The device may be a laser device. Alternatively, the device may be a light-emitting diode.

BRIEF DESCRIPTION OF THE DRAWINGS

Preferred embodiment of the present invention will now be described by way of illustrative examples with reference to the accompanying Figures in which:

FIG. 2 shows the band energy of GaInP as a function of the concentration of In;

DESCRIPTION OF THE PREFERRED EMBODIMENTS

Figure 5A:
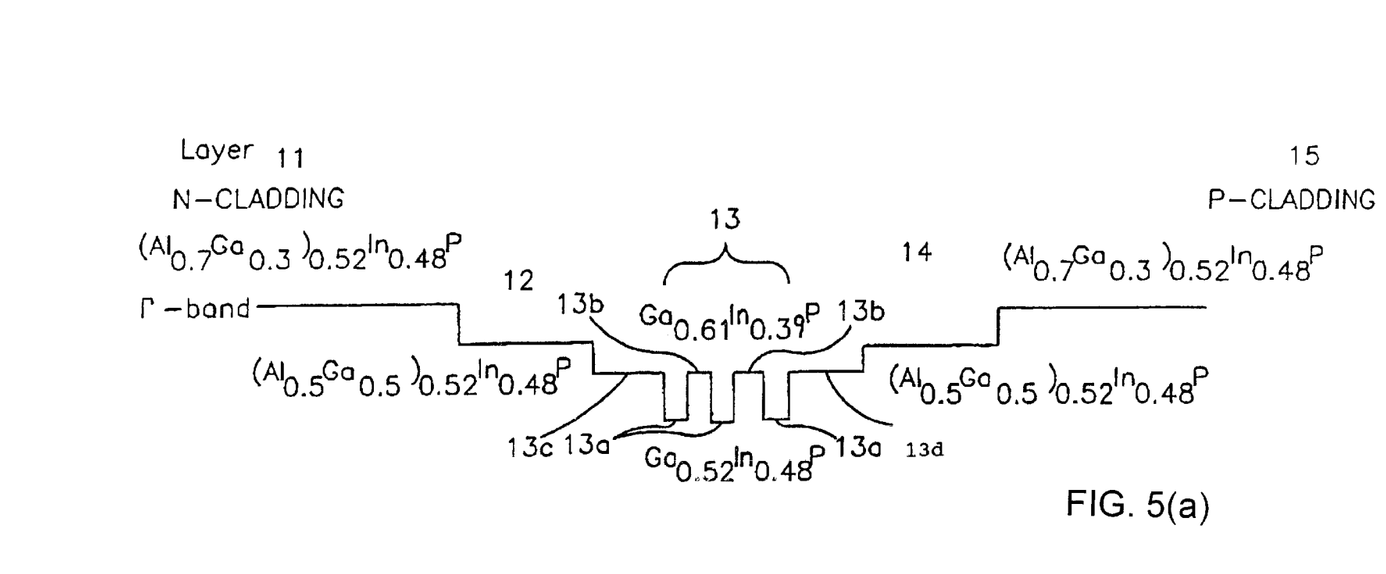
FIG. 5(a) is a schematic band-gap diagram of a laser device according to an embodiment of the present invention.
Figure 5B:
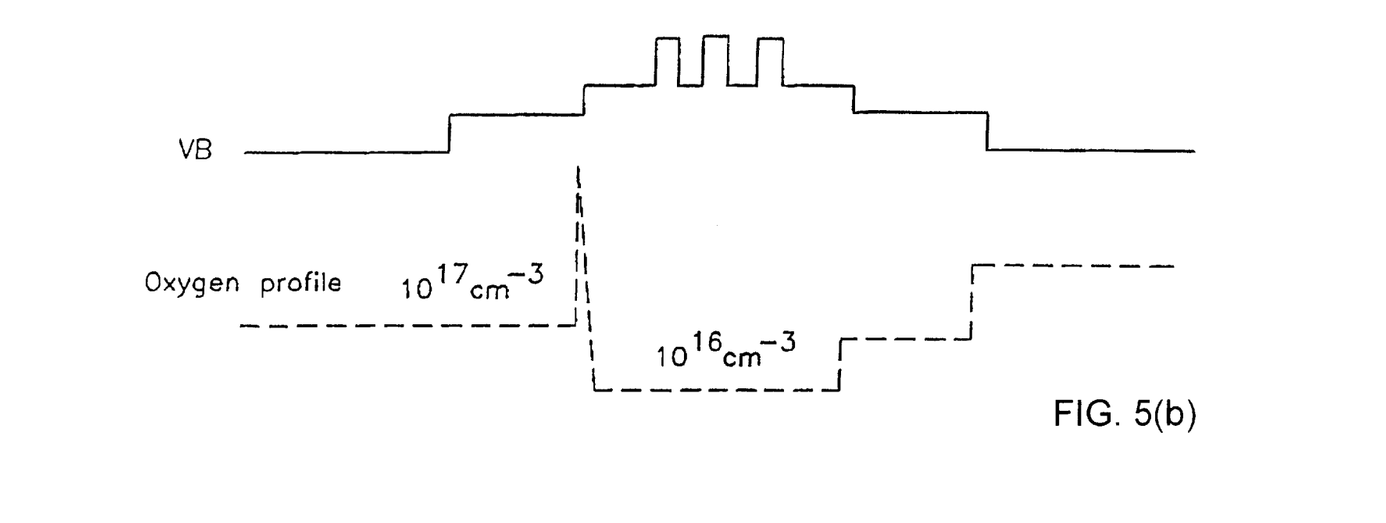
FIG. 5(b) shows the oxygen concentration of the laser device of FIG. 5(a)

FIG. 5(a) shows the Γ-conduction band (upper trace) and the valence band (VB) (lower trace) of a laser device for emitting light in the wavelength range 630–680 nm according to an embodiment of the present invention. As with the prior art laser devices described above, the laser device has an n-type cladding region 11, an optical guiding region 12, 14, an active region 13 disposed within the optical guiding region, and a p-type cladding region 15. In the embodiment of FIG. 5(a) the laser device of the invention is fabricated in the (Al,Ga,In)P system. The n-type and p-type cladding layers 11, 15 are formed of $(Al_{0.7}Ga_{0.3})_{0.52}In_{0.48}P$, and the optical guiding region 12, 14 is formed of $(Al_{0.5}Ga_{0.5})_{0.52}In_{0.48}P$, so that the cladding layers and optical guiding region are lattice matched to the GaAs substrate (not shown in FIG. 5(a)).

The active region 13 includes a plurality of quantum well layers 13a separated by barrier layers 13b. In contrast with the prior art laser device shown in FIG. 1(c), both the quantum well layers 13a and the barrier layers 13b are formed of $Ga_xIn_{1-x}P$. Neither the barrier layers nor the quantum well layers contain Al, so that the oxygen concentration in the active region is significantly reduced. Since the active region does not include any aluminium-containing alloys, the oxygen impurity concentration in the active region it expected to be lower than $10^{16}$ cm$^{-3}$.

Figure 2:
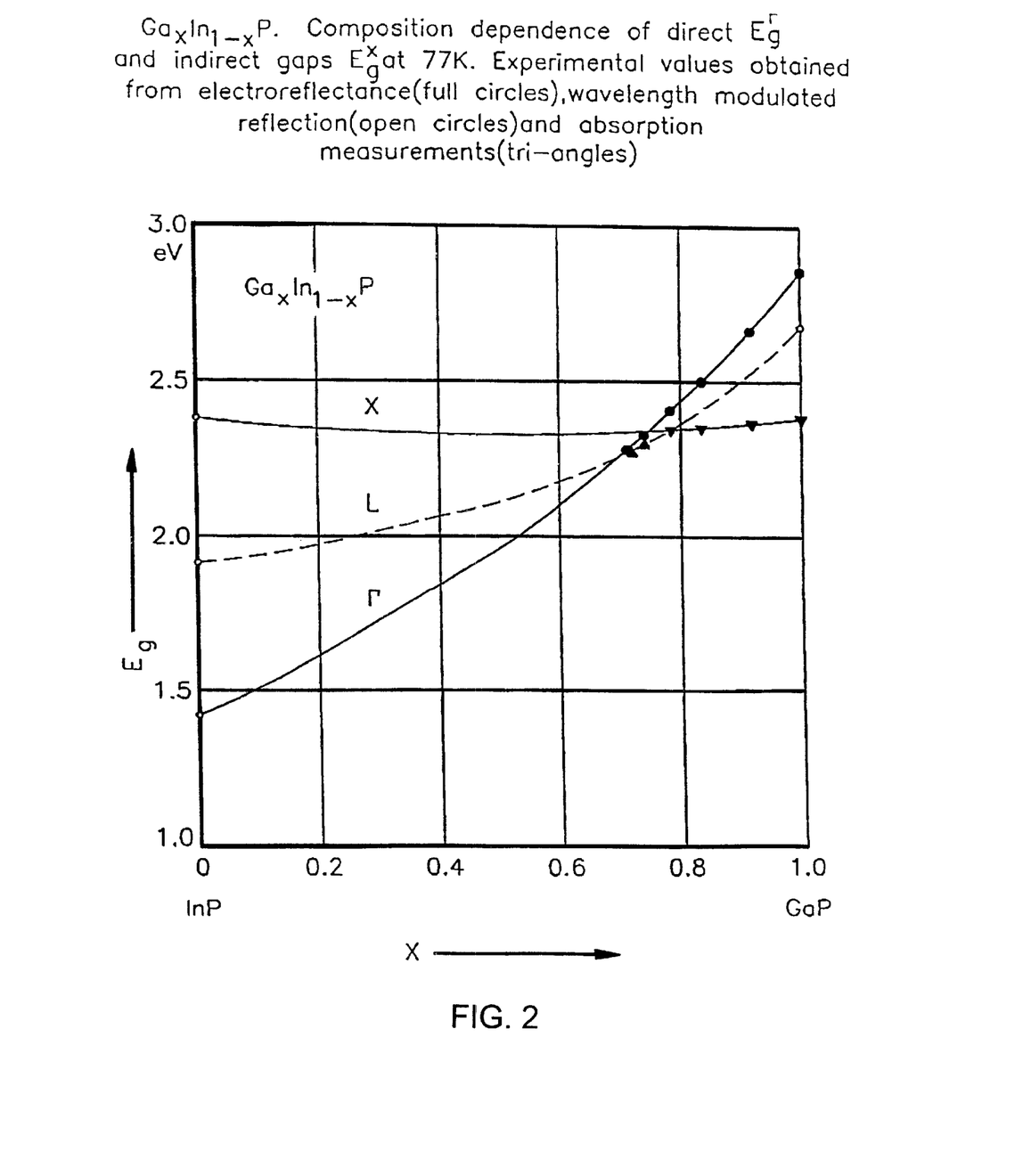

GaP is an indirect semiconductor, with Γ-Γ and Γ-X band-gaps of 2.9 eV and 2.3 eV respectively. Its lattice constant is 5.451 Å. InP is a direct band-gap material with Γ-Γ and Γ-X band-gaps of 1.4 eV and 2.3 eV respectively. Its lattice constant is 5.85 A. As the indium concentration in $Ga_xIn_{1-x}P$, is increased, the lattice constant increases. $Ga_{0.52}In_{0.48}P$ has a lattice constant of 5.653 Å, and so is lattice matched to GaAs. As the indium mole fraction of $Ga_xIn_{1-x}P$ is increased, its band-gap is reduced. FIG. 2 shows the dependence of the band-gap of $Ga_xIn_{1-x}P$ on its composition. It shows experimental valves obtained at 77K from electroreflectance (full circles), wavelength modulated reflection (open circles) and absorption measurements (triangles) (from Landolt-Bornstein, Vol 17, Springer-Verlag).

Applying tensile or compressive strain to a GaP and GaInP layer will change the band-gap of the material from the value expected for the bulk material. A thin GaP layer has a 3.7% lattice mismatch with respect to GaAs. If a thin GaP layer is grown on GaAs, or on a layer that is lattice-matched to GaAs, it will be in a state of tensile strain. This tensile strain will reduce the Γ-Γ band-gap by 0.144 eV from the band-gap of bulk GaP, to give a Γ-Γ band-gap of around 2.756 eV. The tensile strain will also cause the Γ-X band-gap to increase slightly, to around 2.30 eV.

It can thus be seen that changing the indium mole-fraction of a $Ga_xIn_{1-x}P$ layer changes the band-gap of the layer. Thus, it is possible to replace a layer of an aluminum-containing alloy by a strained layer of $Ga_xIn_{1-x}P$ with approximately the same band-gap, by choosing the lndium mole fraction suitably. For example, the values of the Γ-Γ and Γ-X band-gaps for a tensile strained GaP layer are very similar to the band-gaps of AlInP. As a further example, GaInP materials with a gallium mole fraction in the range 0.53 to 0.75 (that is, an indium mole fraction is the range 0.47 to 0.25) have a band-gap equivalent to $(Al_xGa_{1-x})_{0.52}In_{0.48}P$ for the range $0.1<x<0.5$.

In the embodiment of FIG. 5(a), the quantum well layers 13a are formed of $Ga_{0.52}In_{0.48}P$, so that these layers are lattice matched to the cladding layers 11, 15 and the optical guiding region 12, 14. This material has a Γ-Γ band-gap of approximately 2.0 eV.

The barrier layers 13b of the laser of FIG. 5(a) are formed of $Ga_{0.61}In_{0.39}P$. This has a lattice constant of 5.617 Å and so has a lattice mis-match of around 0.6% with regard to the $Ga_{0.52}In_{0.46}P$ active layers 13a. In general, dislocations would occur at an interface between two semiconductor materials having such a lattice mismatch. This is undesirable in the present case, since these dislocations would degrade the properties of the laser device.

It is well known that if the lattice mismatch between an underlying layer and a growing epilayer is sufficiently small, the first atomic layers of the epilayer that are deposited will be strained to match the lattice constant of the underlying layer so that a coherent interface will be formed. However, as the thickness of the growing epilayer increases, the homogeneous strain energy increases until a critical thickness is reached at which it becomes energetically favourable for misfit dislocations to be introduced. The existence of this critical thickness was first disclosed by J. H. Van der Merwe in "Journal of Applied Physics" Vol. 34, p123 (1962). In the present invention, where the barrier layer is not lattice matched to the quantum well layers it to preferable that the thickness of the barrier layer is lower than the critical thickness, to prevent dislocations occuring. In this case, the barrier layer will be in a strained state.

When a $Ga_{0.61}In_{0.39}P$ layer is grown on a $Ga_{0.52}In_{0.48}P$ layer, which is lattice matched to GaAs, the blocking layer will be in a state of tensile strain since it has a lower lattice constant than the quantum well layer.

For a lattice mismatch of 0.6%, the critical thickness at which misfit dislocations will occur is estimated to be 90 Å, see R. People et al., "Applied Physics Letters" Vol 74, No. 3 pages 322–324 (1985). Where a strained $Ga_{0.61}In_{0.39}P$ layer is used for the barrier layers, as in FIG. 5(a), therefore, the thickness of each barrier layer is preferably 90 Å or less.

The tensile strained $Ga_{0.61}In_{0.39}P$ layers used as the barrier layers 13b in the laser of FIG. 5(a) have the same band-gap as a layer of $(Al_{0.3}Ga_{0.7})_{0.52}In_{0.48}P$ layer. Thus, $(Al_{0.3}Ga_{0.7})_{0.52}In_{0.48}P$ barrier layers 3b used in a laser of the type shown in FIG. 1(c) can be replaced by the tensile strained $Ga_{0.61}In_{0.39}P$ barrier layers 13b of the laser device of FIG. 5(a). This enables an aluminium-free active region to be produced.

The present invention is not limited to the use of $Ga_{0.61}In_{0.39}P$ for the strained barrier layers 13b. If the quantum well layers are formed of $Ga_{0.52}In_{0.48}P$, then the barrier layers 13b can be formed of strained layers of GaInP having a gallium mole fraction in the range of approximately 0.53 to 0.75. A tensile strained barrier layer having a composition within this range will have a band-gap that is sufficiently larger than the band-gap of lattice matched $Ga_{0.52}In_{0.48}P$ to create a quantum well. (As noted above, GaInP materials with a gallium mole fraction in the range 0.53 to 0.75 have a band-gap equivalent to $(Al_xGa_{1-x})_{0.52}In_{0.48}P$ for the range $0.1<x<0.5$)

For example, a strained layer of $Ga_{0.71}In_{0.29}P$ has a Γ-Γ band-gap of approximately 2.3 eV, which is approximately the same band-gap as $(Al_{0.5}Ga_{0.5})_{0.52}In_{0.48}P$. Thus, strained layers of $Ga_{0.71}In_{0.29}P$ can be used in place of the $(Al_{0.5}Ga_{0.5})_{0.52}In_{0.46}P$ barrier layers of the laser of FIG. 1(σ), and this will allow an aluminium-free active region to be produced without significantly altering the band-gap profile of the active region. $Ga_{0.71}In_{0.29}P$ has a lattice constant of 5.577 Å, so where a $Ga_{0.71}In_{0.29}P$ layer is grown on a layer that is lattice-matched to GaAs it has a critical thickness of around 42 Å. Thus, to prevent the formation of dislocations the thickness of the barrier layers 13b is preferably less than 42 Å.

As noted above, a laser of the present invention will emit light in the 630–680 nm wavelength range. For a fixed gallium/indium ratio of the quantum well layers 13a, the bandgap of the active region and hence the emission wavelength of the laser can be tuned by varying the thickness of the quantum well layers 13a and so varying the overall thickness of the active region 13. Thus by varying the thickness of the quantum well layers the emission wavelength of a laser of the present invention can be tuned to a selected wavelength in the 630–680 nm range, and in particular to a wavelength in the 635–650 nm range. As an example, to obtain an emission wavelength of 650 nm the $Ga_{0.52}In_{0.48}P$ quantum well layers 13a in the embodiment of FIG. 5(a) should each have a thickness of approximately 10 nm. As a further example, in the embodiment of FIG. 6(a) the quantum well layers should each have a thickness of approximately 60 nm to obtain an emission wavelength of 650 nm.

If a thick barrier layer is desired, it is necessary to use a GaInP layer that is almost lattice-matched to the active layers, so that the critical thickness is large. In the case of a $Ga_{0.52}In_{0.48}P$ active layer, using a tensile strained layer of $Ga_{0.55}In_{0.45}P$ will give a critical thickness for the barrier layer of around 300 Å. A tensile strained layer of this material has a Γ-Γ band-gap of around 2.75 eV.

Although the active region 13 of the laser shown in FIG. 5(a) does not contain aluminium, and so has a low oxygen concentration, there is inevitably a high oxygen concentration at the interface between the optical guiding region 12 and the active region 13. This is because oxygen tends to accumulate at the interface during the growth process, as explained above.

In order to minimise the effect of this oxygen spike on the properties of the laser, it is preferable to provide an aluminium-free spacer layer between the outer most quantum well layer on the n-side of the active region and the n-side part 12 of the optical guiding region. The laser device shown in FIG. 5(a) is provided with an aluminium-free spacer layer 13c. In the embodiment of FIG. 5(a), the aluminium-free spacer region is formed of a layer of $Ga_{0.61}In_{0.39}P$, and this layer will be in tensile strain. The spacer region is not limited to $Ga_{0.61}In_{0.39}P$, and can be formed of $Ga_yIn_{1-y}P$ where $0.5 \leq y \leq 0.65$. It is also possible to provide a second aluminium-free spacer layer 13d between the outermost quantum well layer on the p-side of the active region and the p-side part 14 of the optical guiding region.

The quantum well layers 13a in the laser device shown in FIG. 5(a) are nominally unstrained, since they are lattice-matched to the substrate. It is possible, however, that the use of tensile strained barrier layers 13b might inadvertently introduce strain into the quantum well layers, thereby producing a net strain within the active region. Although it might sometimes be desirable for the active region to be strained, for example to reduce the threshold current, it is possible to prevent significant strain being set up in the active region by making the quantum well layers of a material that is in compressive strain with regard to the cladding layers and the optical guiding layers. In order to introduce compressive strain into the quantum well layers 13a, it is necessary simply to reduce the gallium mole fraction of the quantum well layers below 0.52, and so make the lattice constant of the quantum well layers larger than the lattice constant of GaAs.

Figure 6A:
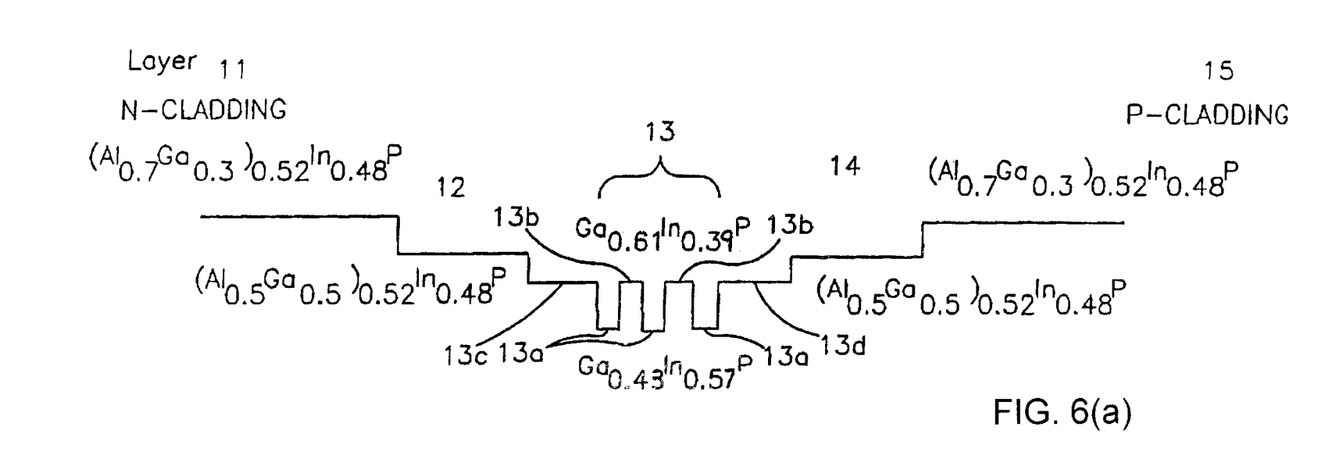
FIG. 6(a) is a schematic band-gap diagram of a laser device according to a second embodiment of the present invention.

FIG. 6(a) shows an embodiment of a laser device of the invention in which the quantum well layers 13a are compressive strained layers and the barrier layers are tensile strained layers. In this embodiment, the substrate (not shown) is again GaAs, the quantum well layers 13a are layers of $Ga_{0.43}In_{0.57}P$, and the barrier layers are layers of $Ga_{0.61}In_{0.39}P$. In this embodiment, a strain-compensated active region, that has no net strain, is produced. It has been suggested, by T. Katsuyama et al in "Electronics Letters" Vol 26, No. 17, pages 1375–1377 (1990) that the use of a strain compensated active layer will lower the threshold of the laser device.

Figure 6B:
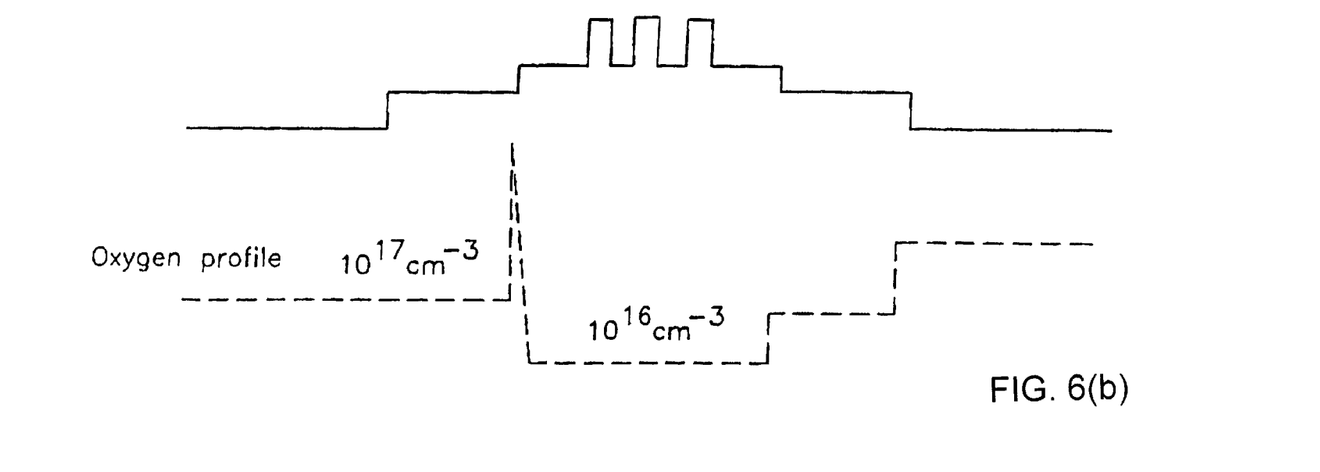
FIG. 6(b) shows the oxygen concentration of the laser of FIG. 6(a)

FIG. 6(b) shows the oxygen concentration of the laser of FIG. 6(a). It will again be seen that the oxygen concentration in the active region is extremely low, being around $10^{61}$ $cm^{-3}$. Although there is a "spike" in the oxygen profile at the interface with the optical guiding region 12, the effect of this spike on the laser properties can again be minimised by providing aluminium-free spacer layers 13c, 13d as in the embodiment of FIG. 5(a).

Figure 7:
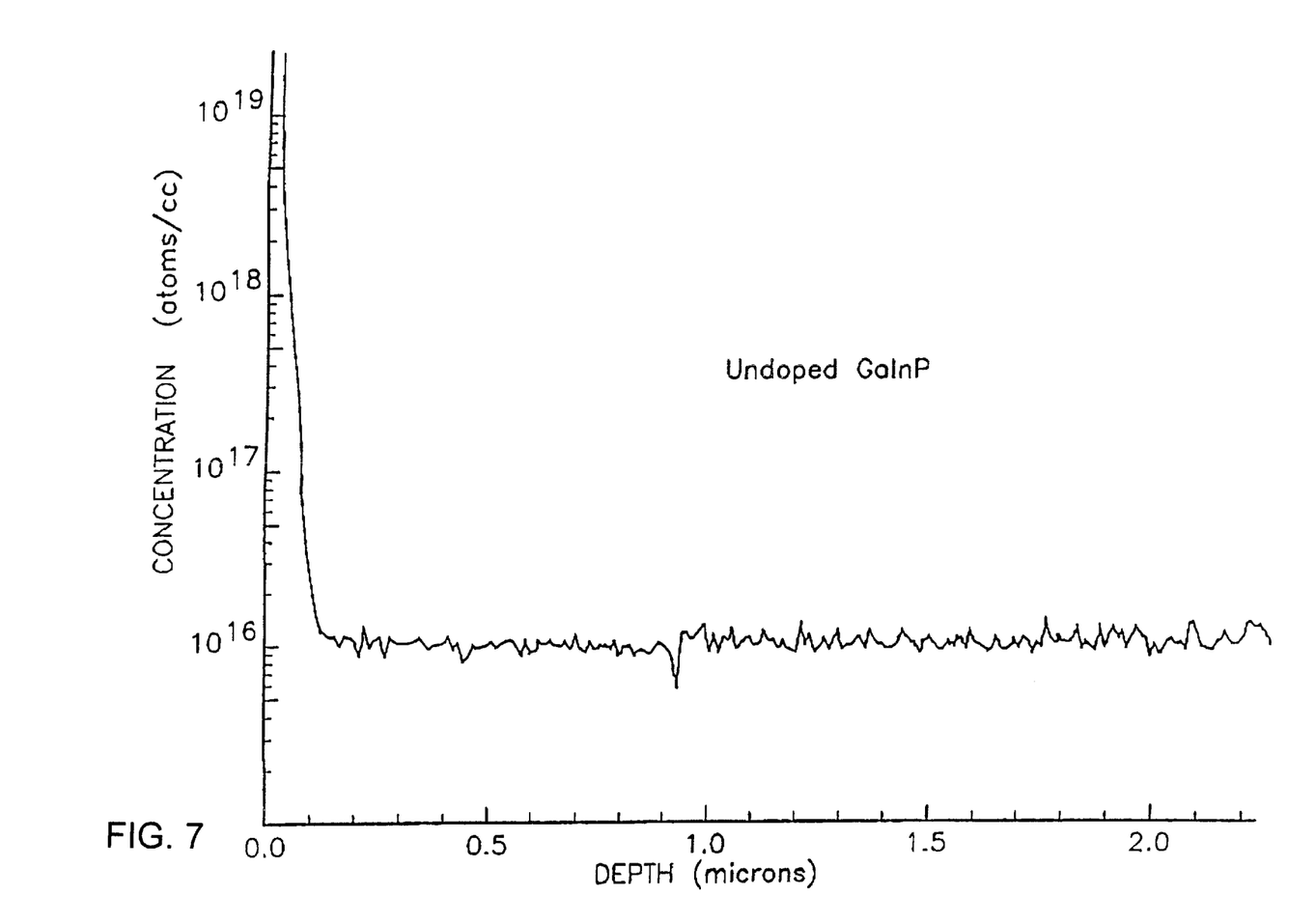
FIG. 7 shows the oxygen concentration of undoped GaInP.

FIG. 7 shows the oxygen concentration of undoped GaInP as measured by secondary ion mass spectrometry (SIMS). This shows that the oxygen concentration of this material is at or below the limit of detection (approximately $1 \times 10^{16}$ $cm^{-3}$) of the measurement device.

The oxygen concentration of undoped GaInP is expected to be approximately $10^5$ $cm^{-3}$. (The peak in the oxygen concentration at depths below about 0.1 μm arises partly from oxygen contamination of the surface of the sample and partly from the SIMS instrument "settling" into the etch.)

Figure 8:
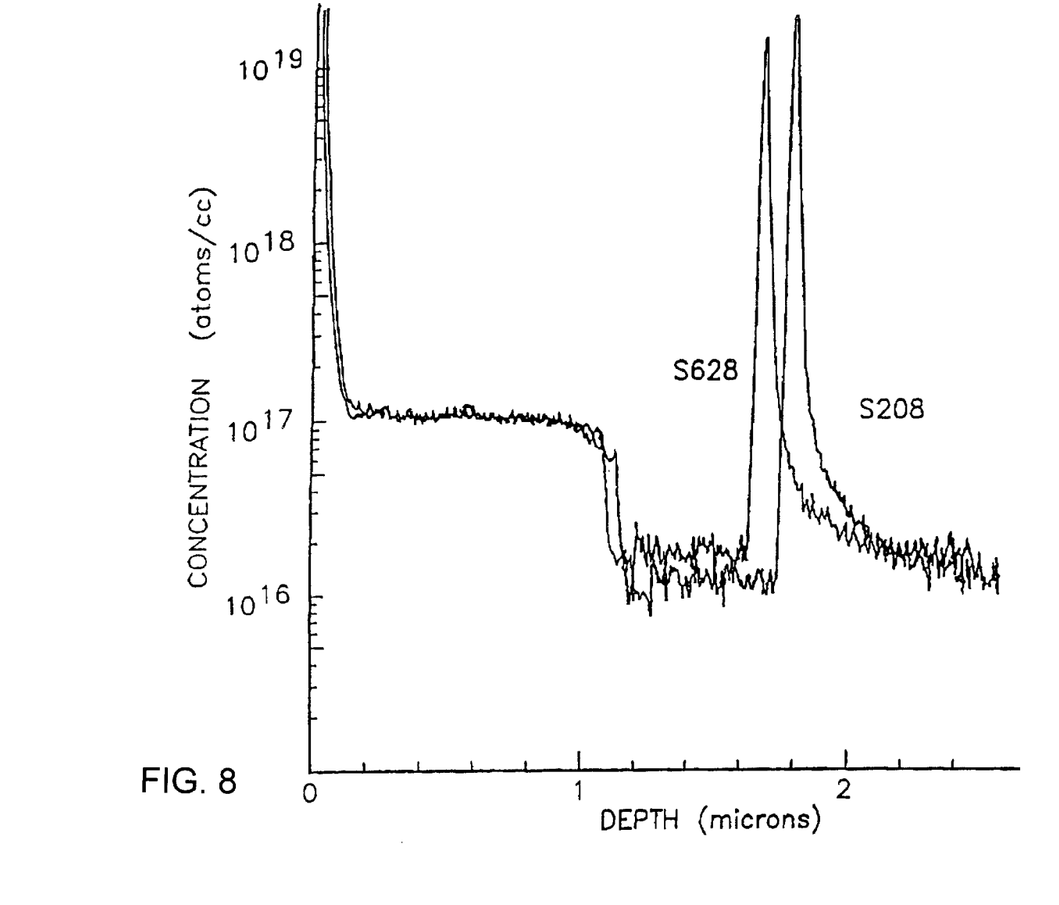
FIG. 8 shows the oxygen concentration in beryllium-doped $(Al_{0.7}Ga_{0.3})_{0.52}In_{0.48}$.

In contrast, the oxygen concentration of AlGaInP is shown in FIG. 8. This shows the oxygen concentration for a sample consisting of a 1 μm thick AlGaInP layer, a GaInP layer, and a substrate. The AlGaInP layer, which extends to a depth of around 1 μm, has an oxygen concentration of around $1 \times 10^{17}$ $cm^{-3}$. The oxygen concentration of the GaInP layer, which extends from about 1 μm to 1.6 μm in depth, is, as in FIG. 7, at or below the limit of detection (approximately $1 \times 10^{16}$ $cm^{-3}$) of the measurement device. (The peak in the oxygen concentration at depths of about 1.6 to 1.8 μm is at the interface between the epilayer and the substrate, and is due to oxygen not having been completely removed from the surface of the substrate before the epitaxial growth process.)

FIG. 8 shows SIMS results for two nominally identical AlGaInP samples. The samples were grown several years apart, and it can be seen that the oxygen impurity concentration has not changed as a function of time.

The invention has been described above with reference to laser devices. However, the invention is not limited to use with laser devices and can be applied to other semiconductor devices such as, for example, a light-emitting diode.

What is claimed is:

1. A semiconductor device having an aluminium-free active region, the active layer comprising one or more quantum well layers and one or more barrier layers, the quantum well layer(s) and the barrier layer(s) being disposed alternatively;

wherein the or each barrier layer is a strained layer; the device further comprises a first cladding layer and an aluminium-free layer disposed between the first cladding layer and the quantum well layer closest to the first cladding layer, and the device is adapted to emit, in use, light having a wavelength in the range 630 to 680 nm.

2. A device as claimed in claim 1 and adapted to emit, in use, light having a wavelength in the range 635 to 650 nm.

3. A device as claimed in claim 1, wherein the or each barrier layer is a tensile strained layer.

4. A device as claimed in claim 1, wherein the lattice mismatch between the or each barrier layer and the or each quantum well layer is small.

5. A device as claimed in claim 1, wherein the or each quantum well layer is lattice matched to the first cladding layer.

6. A device as claimed in claim 1, wherein the or each quantum well layer is a compressive strained layer.

7. A device as claimed in claim 1, wherein the or each barrier layer contains indium.

8. A device as claimed in claim 1 and fabricated in the (Al,Ga,In)P material system.

9. A device as claimed in claim 8, wherein the or each quantum well layer is a $Ga_xIn_{1-x}P$ layer and the or each barrier layer is a $Ga_yIn_{1-y}P$ layer, where y>x.

10. A device as claimed in claim 8, wherein the or each active layer is a $Ga_{0.52}In_{0.42}P$ layer and the or each barrier layer is a $Ga_{0.61}In_{0.39}P$ layer.

11. A device as claimed in claim 8, wherein the or each active layer is a $Ga_{0.52}In_{0.48}P$ layer and the or each barrier layer is a $Ga_{0.71}In_{0.29}P$ layer.

12. A device as claimed in claim 8, wherein the or each active layer is a $Ga_{0.43}In_{0.57}P$ layer.

13. A device as claimed in claim 1, wherein the device is a laser.

14. A device as claimed in claim 1, wherein the device is a light-emitting diode.

15. A semiconductor device having an aluminium-free active region, the active layer comprising one or more quantum well layers and one or more barrier layers, the quantum well layer(s) and the barrier layer(s) being disposed alternately;

wherein the or each barrier layer is a strained layer; and wherein the device emits, in use, light having a wavelength in the range 630 to 680 nm.

16. A device as claimed in claim 15 and further comprising:

a first cladding layer; and an aluminium-free layer disposed between the first cladding layer and the quantum well layer closest to the first cladding layer.

17. A device as claimed in claim 15 and adapted to emit, in use, light having a wavelength in the range 635 to 650 nm.

18. A device as claimed in claim 15, wherein the or each barrier layer is a tensile strained layer.

19. A device as claimed in claim 15, wherein the lattice mismatch between the or each barrier layer and the or each quantum well layer is small.

20. A device as claimed in claim 15, wherein the or each quantum well layer is lattice matched to the first cladding layer.

21. A device as claimed in claim 15, wherein the or each quantum well layer is a compressive strained layer.

22. A device as claimed in claim 15, wherein the or each barrier layer contains indium.

23. A device as claimed in claim 15, wherein the aluminium-free layer is a strained layer.

24. A device as claimed in claim 15, and fabricated in the (Al,Ga,In)P material system.

25. A device as claimed in claim 24, wherein the or each quantum well layer is a $Ga_xIn_{1-x}P$ layer and the or each barrier layer is a $Ga_yIn_{1-y}P$ layer, where y>x.

26. A device as claimed in claim 24, wherein the or each active layer is a $Ga_{0.52}In_{0.46}P$ layer and the or each barrier layer is a $Ga_{0.61}In_{0.39}P$ layer.

27. A device as claimed in claim 24, wherein the or each active layer is a $Ga_{0.52}In_{0.46}P$ layer and the or each barrier layer is a $Ga_{0.71}In_{0.29}P$ layer.

28. A device as claimed in claim 24, wherein the or each active layer is a $Ga_{0.43}In_{0.57}P$ layer.

29. A device as claimed in claim 15, wherein the device is a laser.

30. A device as claimed in claim 15, wherein the device is a light-emitting diode.

* * * * *